United States Patent
De Gouy et al.

(10) Patent No.: US 6,388,601 B1
(45) Date of Patent: May 14, 2002

(54) DELAY COMPENSATION FOR ANALOG-TO-DIGITAL CONVERTER IN SIGMA-DELTA MODULATORS

(75) Inventors: Jean-Luc De Gouy, Briis sous Forges; Pascal Gabet, Chaville; Philippe Benabes, Les Ulis, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/830,150

(22) PCT Filed: Oct. 22, 1999

(86) PCT No.: PCT/FR99/02579
§ 371 Date: Apr. 23, 2001
§ 102(e) Date: Apr. 23, 2001

(87) PCT Pub. No.: WO00/25428
PCT Pub. Date: May 4, 2000

(30) Foreign Application Priority Data

Oct. 23, 1998 (FR) .............................. 98 13324

(51) Int. Cl.⁷ .............................................. H03M 1/12
(52) U.S. Cl. ........................................ 341/155; 341/143
(58) Field of Search ................................. 341/155, 144, 341/145, 156, 143, 118, 120, 122, 123, 110

(56) References Cited

U.S. PATENT DOCUMENTS

| | | | |
|---|---|---|---|
| 5,181,032 A | * 1/1993 | Ribner | 341/143 |
| 5,668,552 A | * 9/1997 | Thurston | 341/143 |
| 5,729,182 A | 3/1998 | Fousset et al. | |
| 5,959,562 A | * 9/1999 | Wiesbauer | 341/143 |
| 5,982,313 A | * 11/1999 | Brooks et al. | 341/143 |
| 6,075,474 A | 6/2000 | Gabet et al. | |
| 6,107,843 A | 8/2000 | De Gouy et al. | |
| 6,191,657 B1 | 2/2001 | Brunet et al. | |

* cited by examiner

*Primary Examiner*—Brian Young
*Assistant Examiner*—John Nguyen
(74) *Attorney, Agent, or Firm*—Oblon, Spivak, McClelland, Maier & Neustadt, P.C.

(57) ABSTRACT

A sigma-delta modulator having a propagation delay $\Delta t$ between an input of an analog-to-digital converter and an output of the digital-to-analog converter. A subtractor is located in a direct chain between an amplification unit and the analog-to-direct converter. The output of the amplification unit is connected to a first direct input of the subtractor. An output of the subtractor is connected to the input of the analog-to-digital convertor. The modulator also includes a compensation filter located between the output of the subtractor and a second inverter input of the subtractor. When considering an impulse response of the modulator, at the output of the subtractor, to an impulse sent at the output of the subtractor, including a first part covering a first time interval 0; T with $T \geq \Delta t$, and a second part covering a second time interval T; , the compensation filter is designed to contribute to the first part and the amplification unit is designed to contribute only to the second part. Such a sigma-delta modulator may be used in a radar processing chain.

9 Claims, 2 Drawing Sheets

DELAY COMPENSATION FOR ANALOG-TO-DIGITAL CONVERTER IN SIGMA-DELTA MODULATORS

The invention pertains to the field of sigma-delta modulators. Conventionally, a sigma-delta modulator comprises an amplification unit, an analog-to-digital converter and a digital-to-analog converter. The modulator renders the analog-to-digital conversion by the analog-to-digital converter, contained in the modulator, slower but more precise, by reducing the quantification noise of the analog-to-digital converter. The modulator can be subdivided up into a direct chain, comprising the amplification unit and the analog-to-digital converter, and a feedback loop comprising the digital-to-analog converter.

An efficient sigma-delta modulator has high value gain. Indeed, the quantification noise may be reduced by a factor substantially equal to this gain. However, the value of the gain is limited by constraints related to the stability of the modulator. The basic condition of stability of the system having a feedback loop may be stated as follows: the phase of the system must be higher than −180 degrees when the gain of the system as a function of the frequency is equal to zero decibel. Now, a delay in propagation of the signal within the system has the effect of reducing its phase, and therefore of lowering its stability. Consequently, a delay in propagation between the input of the analog-to-digital converter and the output of the digital-to-analog converter has the effect of lowering this stability, and even leading to instability in the modulator. One of the objects of the invention is to propose a sigma-delta modulator used to compensate for the effects, on the stability of the modulator, of the delay in propagation between the input of the analog-to-digital converter and the output of the digital-to-analog converter. This sigma-delta modulator is used to compensate for the delay of the analog-to-digital converter and the delay of the digital-to-analog converter.

For this purpose, a first prior art approach consists in reducing the gain of the modulator so that the modulator is stable despite the delay in propagation. However, this reduction in gain causes a reduction in the performance characteristics of the modulator, especially in terms of reduction of the quantification noise.

A second prior art approach consists in reducing the internal sampling frequency of the modulator in order to mask the propagation delay. The internal sampling frequency of the modulator will often be the sampling frequency of the converters. Since the over-sampling rate is the ratio between the output frequency of the information from the modulator and the internal sampling frequency of the modulator, at a given output frequency the reduction in the internal sampling frequency corresponds to a reduction in the over-sampling rate. Now, the reduction in the over-sampling rate is also expressed by a reduction in gain with the same drawbacks as for the first prior art approach.

The invention proposes a modulator comprising a compensation filter used to compensate for the delay in propagation between the input of the analog-to-digital converter and the output of the digital-to-analog converter. This compensation filter is used to preserve the impulse response that the modulator would have had in the absence of a propagation delay. Since there is a one-to-one correspondence between the impulse response of the modulator and the gain of the modulator as a function of frequency, this compensation filter is also used to preserve the gain as a function of the frequency that the modulator would have had in the absence of a propagation delay. To this end, the compensation filter reconstitutes the beginning of this impulse response that is not available because of the delay in-propagation.

According to the invention, there is provided a sigma-delta modulator having an input terminal and an output terminal, comprising:

a direct chain connecting the input terminal of the modulator to the output terminal of the modulator and successively comprising an amplification unit comprising an amplification function with gain greater than unity on a predetermined frequency domain, the input terminal of the modulator being connected to a first direct input of the amplification unit, and an analog-to-digital converter;

a feedback loop connecting the output of the analog-to-digital converter to a second inverter input of the amplification unit and comprising a digital-to-analog converter;

and having a propagation delay Δt between the input of the analog-to-digital converter and the output of the digital-to-analog converter;

characterized in that the sigma-delta modulator also comprises:

a subtractor located in the direct chain between the amplification unit and the analog-to-digital converter, the output of the amplification unit being connected to a first direct input of the subtractor, an output of the subtractor being connected to the input of the analog-to-digital converter;

a compensation filter located between the output of the subtractor and a second inverter input of the subtractor;

and in that, when considering an impulse response of the modulator, at the output of the subtractor, to an impulse sent at the output of the subtractor, comprising a first part covering a first time interval [0; T [ with T≧Δt and a second part covering a second time interval [T; ∞[, the compensation filter is designed to contribute to the first part and the amplification unit is designed to contribute only to the second part.

The invention will be understood more clearly and other features and advantages shall appear from the following description and the attended drawings, given as non-restrictive examples, of which:

FIG. 1 is a diagrammatic view of an embodiment of a sigma-delta modulator according to the invention;

FIGS. 2a and 2b provide a diagrammatic view of the contributions to the impulse response of the modulator, respectively of the compensation filter and the amplification unit;

Figure 1:
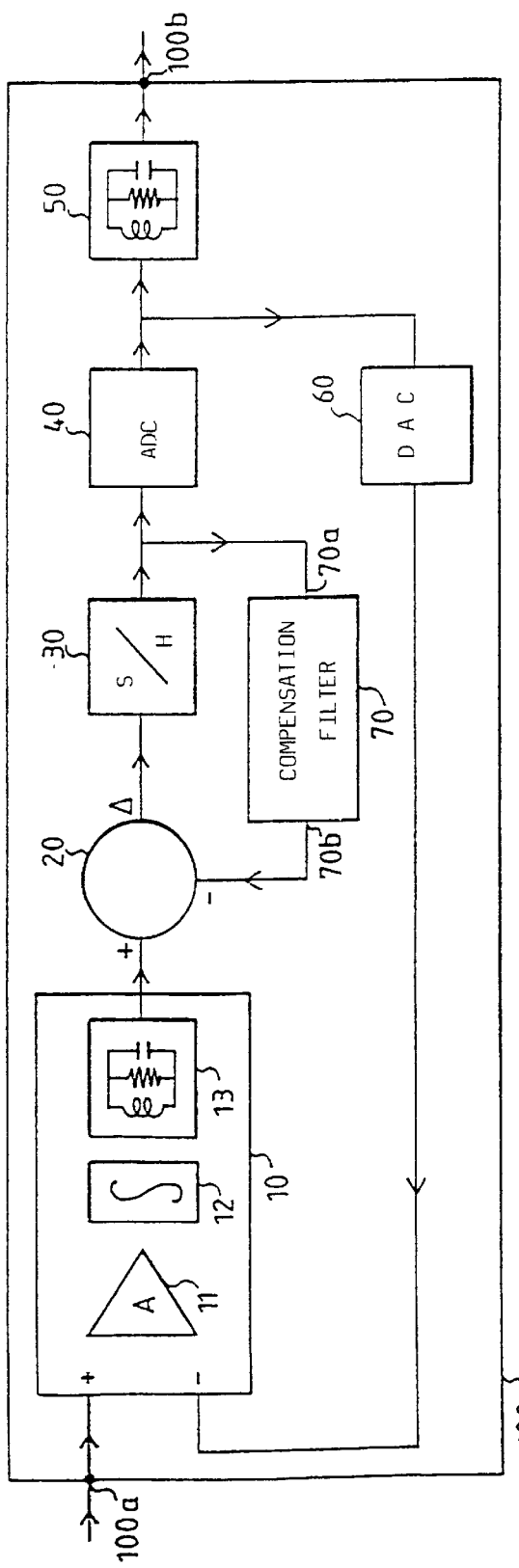

FIG. 1 shows an embodiment of a sigma-delta modulator 100. The arrows indicate the direction of propagation of the signal, preferably a voltage, in the modulator. This modulator 100 has an input terminal 100a and output terminal 100b. The output voltage at the output terminal 100b represents the input voltage at the input terminal 100a, quantified and multiplied by a gain that is preferably variable as a function of the frequency. The input terminal 100a is connected to the first direct input, referenced + in FIG. 1, of an amplification unit 10. The output of the unit 10 is connected to a first direct input, referenced + in FIG. 1, of the subtractor 20. The output, referenced Δ in FIG. 1, of the subtractor 20 is connected to the input of an analog-to-digital converter 40, either directly or preferably by means of a sample-and-hold device 30 in the case of FIG. 1 corresponding to a mode of operation in what is known as ((continuous)) time. It is also possible to envisage, for example, a sample-and-hold function integrated with the analog-to-digital converter 40. In one mode of operation in what is known as the "discrete" time, the sample-and-hold device 30 can be found upline from the input terminal 100a. The output of the analog-to-digital converter 40 is connected to the output terminal 100b, either directly or preferably by means of a cutting-out filter 50. The direct chain is the circuit connecting the input terminal 100a with the output terminal 100b in passing successively through the first direct input of the unit 10, the output of the unit 10, the first direct input of the subtractor 20, the output of the subtractor 20, the sample-and-hold device 30, the analog-to-digital converter 40, the cutting-out filter 50.

The output of the analog-to-digital converter 40 is also connected to the input of the digital-to-analog converter 60. The output of the digital-to-analog converter 60 is connected to a second inverter input, referenced - in FIG. 1, of the amplification unit 10. The feedback loop is the circuit connecting the output of the analog-to-digital converter 40 to the second inverter input of the amplification unit 10, in passing through the digital-to-analog converter 60.

There is a delay $\Delta t$ of propagation of the signal between the input of the analog-to-digital converter 40 and the output of the digital-to-analog converter 60.

Between the output of the subtractor 20 and the second inverter input of the subtractor 20, there is a compensation filter 70 having an input 70a and an output 70b. The input 70a of the compensation filter 70 is connected to the output of the subtractor 20, either directly or preferably by means of a sample-and-hold device 30 when this device 30 is between the output of the subtractor 20 and the input of the analog-to-digital converter 40.

The amplification unit 10 has an amplification function 11. Depending on the application envisaged, the amplification unit 10 also preferably has a time integration function 12 and/or a filter 13 for shaping the gain of the amplification function 11. The unit 10 has two inputs, a first direct input that does not modify the voltage arriving at the input terminal 100a and a second inverter input that inverts the sign of the voltage coming from the output of the digital-to-analog converter 60. The output voltage of the unit 10 is obtained from the voltages present at the two inputs of the unit 10, by the performance of several functions contained in the unit 10. The amplification function 11 has an amplification gain G as a function of frequency. On a predetermined frequency domain depending on the application envisaged, the gain G is greater than unity. This gain G is preferably far greater than unity, for example by a factor of hundred or a factor of thousand. The gain G must also comply with the conditions of stability common to all sigma-delta modulators. The unit 10 preferably has a filter 13 for shaping the gain G of the amplification function 11 according to frequency. The arrangement and special contents of these functions depends on the application envisaged.

The subtractor 20 takes the difference between its first direct input and its second inverter input. The output of the subtractor 20 is equal to this difference. The sample-and-hold device 30 and the analog-to-digital converter 40 are preferably driven by the same sampling frequency. The cutting-out filter 50 cuts out a useful zone in the predetermined frequency domain. This useful zone depends on the application envisaged. The filter 50 is, for example, a lowpass type filter with filtering up to two MHz or, for example, 10-MHz bandpass type filter.

Figure 2A:
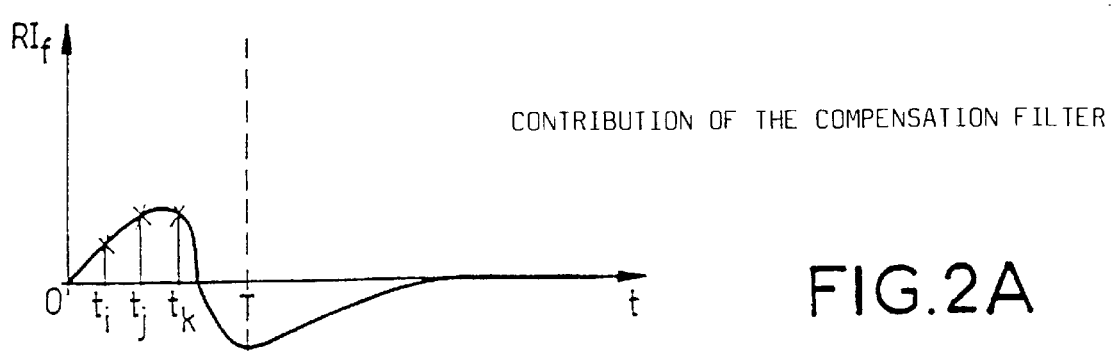
FIG. 2c is a diagrammatic view of the impulse response of the modulator.
Figure 2B:
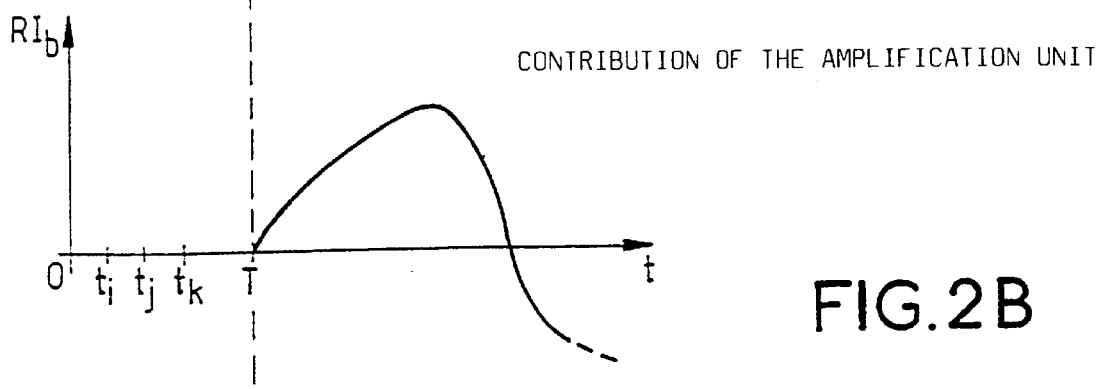
Figure 2C:
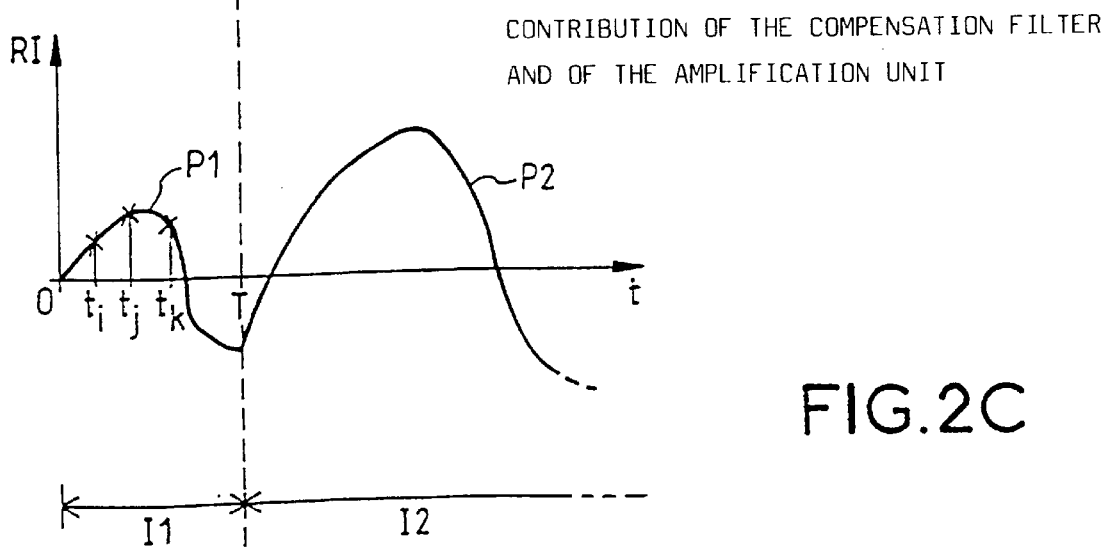

Reference is made to FIGS. 2a to 2c. An impulse is sent to the output of the subtractor 20. Let RI be the impulse response of the modulator 100 at the output of the subtractor 20. FIGS. 2a and 2b represent the contributions $RI_f$ and $RI_b$, to the impulse response RI of the modulator 100 shown in FIG. 2c, respectively of the compensation filter 70 and the unit 10. Let us take a special application requiring the impulse response RI shown in FIG. 2c. This impulse response RI cannot be obtained directly by a special configuration of the unit 10 as in the prior art because of the propagation delay $\Delta t$. Indeed, before the instant $\Delta t$, the impulse sent at the instant 0 to the output of the subtractor 20 has not yet reached the second inverter input of the unit 10. The entire part of the impulse response contained between the instant 0 and the instant $\Delta t$ is therefore not available at the output of the unit 10; Let T be a time greater than or equal to the propagation delay $\Delta t$, T is preferably substantially equal to the delay $\Delta t$ with the addition especially of the respective delays of the sample-and-hold device 30 and the unit 10. I1 is the time interval between the instant 0 and the instant T, T being-excluded from the interval. I2 is the time interval between the instant T, T being included in the interval, and the end of the time axis called . P1 is the first part of the impulse response R1 on the interval I1. P2 is the second part of the impulse response RI on the interval I2.

The propagation delay $\Delta t$ may be in the range of one to several internal sampling periods, typically for example from one to three. In the event of non-compensation for the propagation delay $\Delta t$, the phase shift of the gain G, in the frequency zone where the gain G=0 decibels, exceeds 180 degrees and the modulator 100 becomes unstable. The modulator according to the invention is all the more useful as the analog-to-digital converter 40 is fast. Indeed, the greater the internal sampling frequency, the greater is the propagation delay $\Delta t$ corresponding to a multiple of internal sampling periods, and the more crucial is it that this propagation delay $\Delta t$ should be compensated for.

The compensation filter 70, which is not subjected to the propagation delay $\Delta t$, generates the first part P1 of the impulse response RI. It can also contribute to the second part P2. The contribution $RI_f$ of the compensation filter 70 is shown in FIG. 2a. The contributions $RI_b$ of the unit 10 to the impulse response TI is-shown in FIG. 2b. The unit 10 contributes only to the second part P2. The sum of the contributions $RI_f$ and $RI_b$ give the impulse response RI of the modulator shown in FIG. 2c. The instants ti, tj, tk represent sampling instants in the preferred case of FIG. 1 comprising the sample-and-hold device 30. In this case, for example, it is only the values of the impulse response RI at the sampling instants that are important: outside these sampling instants, the impulse response RI could take any values. However, preferably, the contribution $RI_f$ of the compensation filter 70 to the first part P1 of the impulse response RI is designed to prevent excessively sudden voltage surges at the input of the sample-and-hold device 30 outside the sampling instants. The compensation filter 70 is then made in what is known as "continuous" time, namely in the form of a filter acting continuously in time, for example in the form of a passive filter of the R,L,C type or else in the form of an active filter.

The sigma-delta modulator preferably uses a fast analog-to-digital converter 40 that has few bits and is therefore not very costly. This converter with few bits is subject to major quantification noise . It is therefore imprecise. One of the valuable features of the sigma-delta modulator is that it uses a fast, low-precision analog-to-digital converter 40 to carry out a slower analog-to-digital conversion, usually with a narrower frequency band but with a higher resolution. As compared with the resolution of the analog-to-digital converter 40, the resolution obtained may be improved by a factor substantially equal to the gain G when this gain is far greater then unity. When the gain G is equal to hundred for example, the resolution may be increased by a factor of hundred.

If K is the amplification gain of the compensation filter 70 as a function of the frequency, the resolution of the modulator 100 can be improved only by a factor approximately equal to G/K once K is substantially equal to one. Preferably, the contribution $RI_f$ of the compensation filter 70 to the second part P2 of the impulse response RI is designed to minimize the gain K on the useful zone of the predetermined frequency domain, thus improving the resolution of the modulator 100.

Figure 3:
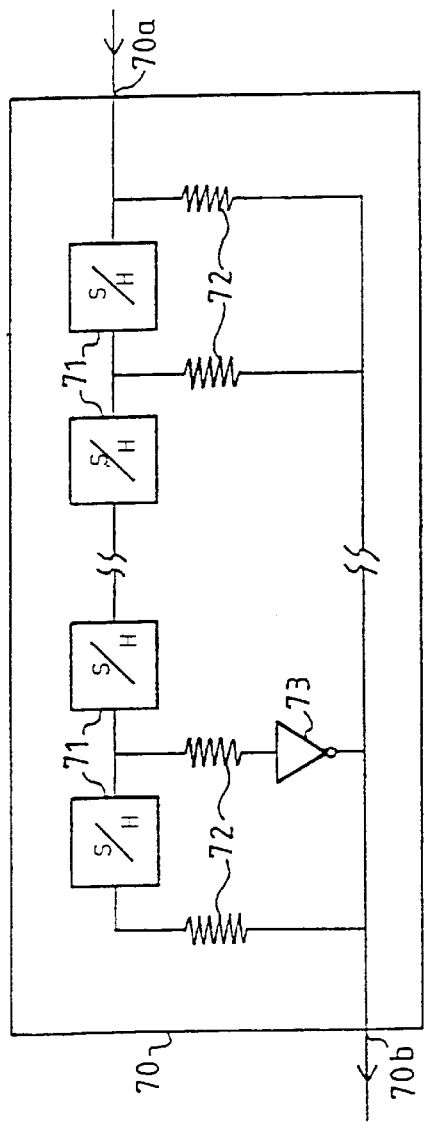
FIG. 3 is a diagrammatic view of an embodiment of the compensation filter of a sigma-delta modulator according to the invention.

FIG. 3 shows an embodiment, in the preferred example of FIG. 1 using a sample-and-hold device 30, of the compensation filter 70. This is what is known as a "discrete" time filter, i.e. it takes the form of a filter that acts only at the sampling instants of the sample-and-hold device 30. The compensation filter 70 has one or more sample-and-hold devices 71. The sample-and-hold devices 71, when there are several of them, are series-connected between the input 70a and the output 70b. The broken lines indicate that the number of sample-and-hold devices 71 is not limited to the four elements shown in FIG. 3. Between the input 70a, connected to the output of the sample-and-hold device 30, and the output 70b, there is a resister 72 and, as the case may be, an inverter 73. Between each output of the sample-and-hold device 71 and the output 70b, there is a resistor 72 and, possibly, an inverter 73. The inverters 73 and the resistors 72 are used to form the first part P1 of the impulse response RI at the sampling instants, each resistor 72 and, as the case may be, each inverter 73 being used to weight the impulse response RI at each sampling instant. The sample-and-hold devices 71 are driven by the same sampling frequency as the sample-and-hold device 30. They are sufficient in number to be able to constitute the entire first part P1.

A sigma-delta modulator with a compensation filter 70 can be used for example in a radar processing chain.

What is claimed is:

1. A sigma-delta modulator having an input terminal and an output terminal, comprising:
   a direct chain connecting the input terminal of the modulator to the output terminal of the modulator and successively comprising an amplification unit comprising an amplification function with gain greater than unity on a predetermined frequency domain, the input terminal of the modulator being connected to a first direct input of the amplification unit, and an analog-to-digital converter;
   a feedback loop connecting the output of the analog-to-digital converter to a second inverter input of the amplification unit and comprising a digital-to-analog converter;
   and having a propagation delay between the input of the analog-to-digital converter and the output of the digital-to-analog converter;
   a subtractor located in the direct chain between the amplification unit and the analog-to-digital-converter, the output of the amplification unit being connected to a first direct input of the subtractor, an output of the subtractor being connected to the input of the analog-to-digital converter;
   a compensation filter located between the output of the subtractor and a second inverter input of the subtractor;
   and in that, when considering an impulse response of the modulator, at the output of the subtractor, to an impulse sent at the output of the subtractor, comprising a first part covering a first time interval 0; T with T≧Δt and a second part covering a second time interval T; , the compensation filter is configured to contribute to the first part and the amplification unit is designed to contribute only to the second part.

2. Modulator according to claim 1, wherein the direct chain comprises, between the output of the analog-digital converter and the output terminal of the modulator, a filter, for cutting out a useful zone in the predetermined frequency domain.

3. Modulator according to claim 2, wherein the compensation filter is further configured to contribute to the second part of the impulse response so as to have an amplification gain of the compensation filter in the useful zone that is a minimum.

4. Modulator according to claim 1, wherein the direct chain comprises a sample-and-hold device driven by a sampling frequency and located between the output of the subtractor and the input of the analog-digital converter, the input of the compensation filter being connected to the output of the sample-and-hold device.

5. Modulator according to claim 4, wherein the compensation filter comprises, from the output of the sample-and-hold device, one or more sample-and-hold devices in series, resistors located between the outputs of the sample-and-hold devices and the second inverter input of the subtractor, the sample-and-hold devices being driven by a same sampling frequency.

6. Modulator according to claim 5, wherein at least one of said resistors is connected to the second inverter input of the subtractor by an inverter.

7. Modulator according to claim 4, wherein, outside sampling instants of the sample-and-hold device, the compensation filter is constituted so as to contribute to the first part of the impulse response in preventing voltage surges at the input of the sample-and-hold device.

8. Modulator according to claim 1, wherein the amplification unit comprises a filter for shaping a gain of the amplification function as a function of the frequency.

9. Modulator according to claim 1, wherein the amplification function has a gain greater than a factor of a hundred.

* * * * *